US 6,915,505 B2

(12) United States Patent
Hsu et al.

(10) Patent No.: US 6,915,505 B2
(45) Date of Patent: Jul. 5, 2005

(54) METHOD AND APPARATUS FOR PERFORMING RULE-BASED GATE SHRINK UTILIZING DIPOLE ILLUMINATION

(75) Inventors: Stephen D. Hsu, Fremont, CA (US); Noel Corcoran, San Jose, CA (US); Jang Fung Chen, Cupertino, CA (US)

(73) Assignee: ASML Masktools B.V., Veldhoven (NL)

( * ) Notice: Subject to any disclaimer, the term of this patent is extended or adjusted under 35 U.S.C. 154(b) by 195 days.

(21) Appl. No.: 10/395,888

(22) Filed: Mar. 25, 2003

(65) Prior Publication Data

US 2004/0003368 A1 Jan. 1, 2004

Related U.S. Application Data

(60) Provisional application No. 60/366,537, filed on Mar. 25, 2002.

(51) Int. Cl.[7] .............................................. G06F 17/50
(52) U.S. Cl. .............................. 716/19; 716/20; 716/21
(58) Field of Search .................................... 716/19–21

(56) References Cited

U.S. PATENT DOCUMENTS

| 5,821,034 A | 10/1998 | Kim et al. |
|---|---|---|
| 5,881,125 A | 3/1999 | Dao |
| 6,055,367 A * | 4/2000 | Liebmann et al. ............. 716/19 |
| 6,553,562 B2 | 4/2003 | Capodieci et al. |
| 6,625,802 B2 | 9/2003 | Singh et al. |
| 2001/0036732 A1 | 11/2001 | Yoshida et al. |

FOREIGN PATENT DOCUMENTS

| EP | 0 852 029 B1 | 8/2000 |
|---|---|---|
| EP | 1 091 252 A2 | 4/2001 |
| EP | 1 152 289 A2 | 11/2001 |

OTHER PUBLICATIONS

Hsu, Stephen D., et al. "65 nm Full–chip Implementation Using Double Dipole Lithography." Optical Microlithography XVI, Santa Clara, California, USA, Feb. 2003, Proceedings of the SPIE– The International Society for Optical Engineering, pp. 215–231, XP 009024366, ISSN: 0277–786X.

Hsu, Stephen D., et al., "Dipole Decomposition Mask–design for full Chip Implmentation at the 100nm Technology Node and Beyond." Proceedings of the SPIE, US, vol. 4691, pp. 476–490, XP 002261072, ISSN: 0277–786X.

Torres, J.A., et al. "Model Assisted Double Dipole Decomposition." Proceedings of the SPIE, vol. 4691, pp. 407–417, XP 002257323 ISSN: 0277–786X.

Torres, J.A., et al., "Design Verification for Model Assisted Double Dipole Decomposition." Proceedings of the SPIE, vol. 4692, pp. 585–592, XP 002261074, ISSN: 0277–786X.

Vandenberghe, G., et al. "(Sub–) 100nm gate patterning using 248 nm alternating PSM." Photomask and Next Generation Lithography Mask Technology VIII, Proceedings of the SPIE, The International Society for Optical Engineering, 2001, pp. 61–69, XP002269152, ISSN: 0277–786X.

* cited by examiner

*Primary Examiner*—Stacy A. Whitmore
(74) *Attorney, Agent, or Firm*—McDermott Will & Emery LLP

(57) ABSTRACT

A method of printing a gate pattern on a substrate comprising the steps of: identifying at least one area in the pattern in which one of the gate features overlays one of the active regions; reducing a width dimension of the one of the gate features at the location which the one of the gate features overlays the one of the active regions; extracting the gate features from the pattern; decomposing the gate features into a vertical component mask and a horizontal component mask; and illuminating the vertical component mask and the horizontal component mask utilizing dipole illumination.

23 Claims, 13 Drawing Sheets

METHOD AND APPARATUS FOR PERFORMING RULE-BASED GATE SHRINK UTILIZING DIPOLE ILLUMINATION

This application claims priority of U.S. Provisional Patent Application No. 60/366,537, filed Mar. 25, 2002.

FIELD OF THE INVENTION

The present invention relates to photolithography, and in particular relates to the generation of mask layouts for use with dipole illumination techniques that provides for both a reduction in the miminal printable gate length of transistors and an improvement in the resulting resolution. In addition, the present invention relates to a device manufacturing method using a lithographic apparatus comprising a radiation system for providing a projection beam of radiation; a mask table for holding a mask, serving to pattern the projection beam; a substrate table for holding a substrate; and a projection system for projecting the patterned projection beam onto a target portion of the substrate.

BACKGROUND OF THE INVENTION

Lithographic projection apparatus (tools) can be used, for example, in the manufacture of integrated circuits (ICs). In such a case, the mask contains a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing. Thereafter, the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The lithographic tool may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic tools are described, for example, in U.S. Pat. No. 5,969,441 and WO 98/40791, incorporated herein by reference.

The photolithography masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD (critical dimension) of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

Furthermore, the constant improvements in microprocessor speed, memory packing density and low power consumption for micro-electronic components are directly related to the ability of lithography techniques to transfer and form patterns onto the various layers of a semiconductor device. The current state of the art requires patterning of CD's well below the available light source wavelengths. For instance the current production wavelength of 248 nm is being pushed towards patterning of CD's smaller than 100 nm. This industry trend will continue and possibly accelerate in the next 5–10 years, as described in the International Technology Roadmap for Semiconductors (ITRS 2000).

Lithographic methods aimed at improving resolution, while retaining acceptable process latitude and robustness are classified as Resolution Enhancement Techniques (RET's) and comprise a very wide range of applications. Examples include: light source modifications (e.g. Off-Axis Illumination), use of special masks, which exploit light interference phenomena (e.g. Attenuated Phase Shift Masks, Alternating Phase Shift Masks, Chromeless Masks, etc.), and mask layout modifications (e.g. Optical Proximity Corrections).

One issue of particular importance to integrated circuit designers is the ability to reduce the length of the transistor gate as much as possible. As is known, a reduction in the length of the transistor gate results in an increase in the operating speed of the transistor, as well as provide a corresponding reduction in power requirements. In addition, a reduced gate length increases the transistor's ability to turn-off more completely at a lower voltage level and reduces leakage current. Thus, accurate reproduction of transistors having a reduced gate width is highly desirable.

Accordingly, there exists a need for a method which allows a further reduction in the minimum gate length obtainable utilizing currently available photolithography equipment, so as to provide for the foregoing advantages associated with a reduction in the gate length of a transistor.

SUMMARY OF THE INVENTION

In an effort to solve the foregoing needs, it is one object of the present invention to provide a method for reducing the gate length of transistors contained in integrated circuits utilizing currently available photolithography technology. In other words, it is an object of the present invention to provide a method for printing gates exhibiting a reduced length, while maintaining a high level of resolution. Moreover, it is an object of the present invention to allow for the reduction of gate length without requiring a complete resealing of the semiconductor design.

More specifically, in one exemplary embodiment, the present invention relates to a method of printing a gate pattern on a substrate comprising the steps of: identifying at least one area in the pattern in which one of the gate features overlays one of the active regions; reducing a width dimension of the one of the gate features at the location which the one of the gate features overlays the one of the active regions; extracting the gates features from the pattern; decomposing the gate features into a vertical component mask and a horizontal component mask; and illuminating the vertical component mask and the horizontal component mask utilizing dipole illumination.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

b) A programmable LCD array. An example of such a construction is given in U.S. Pat. No. 5,229,872, which is incorporated herein by reference.

The method of the present invention provides important advantages over the prior art. For example, the present invention provides a simple method for reducing the gate length of the transistor utilizing currently available photolithography technologies. As noted above, a reduced gate length advantageously results in an increase in transistor operating speed, a reduction in transistor power requirements, and a reduction in leakage current. Importantly, the technique of the present invention allows for the reduction in the transistor gate length without a complete resealing of the semiconductor design.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

DETAILED DESCRIPTION OF THE INVENTION

Figure 1:
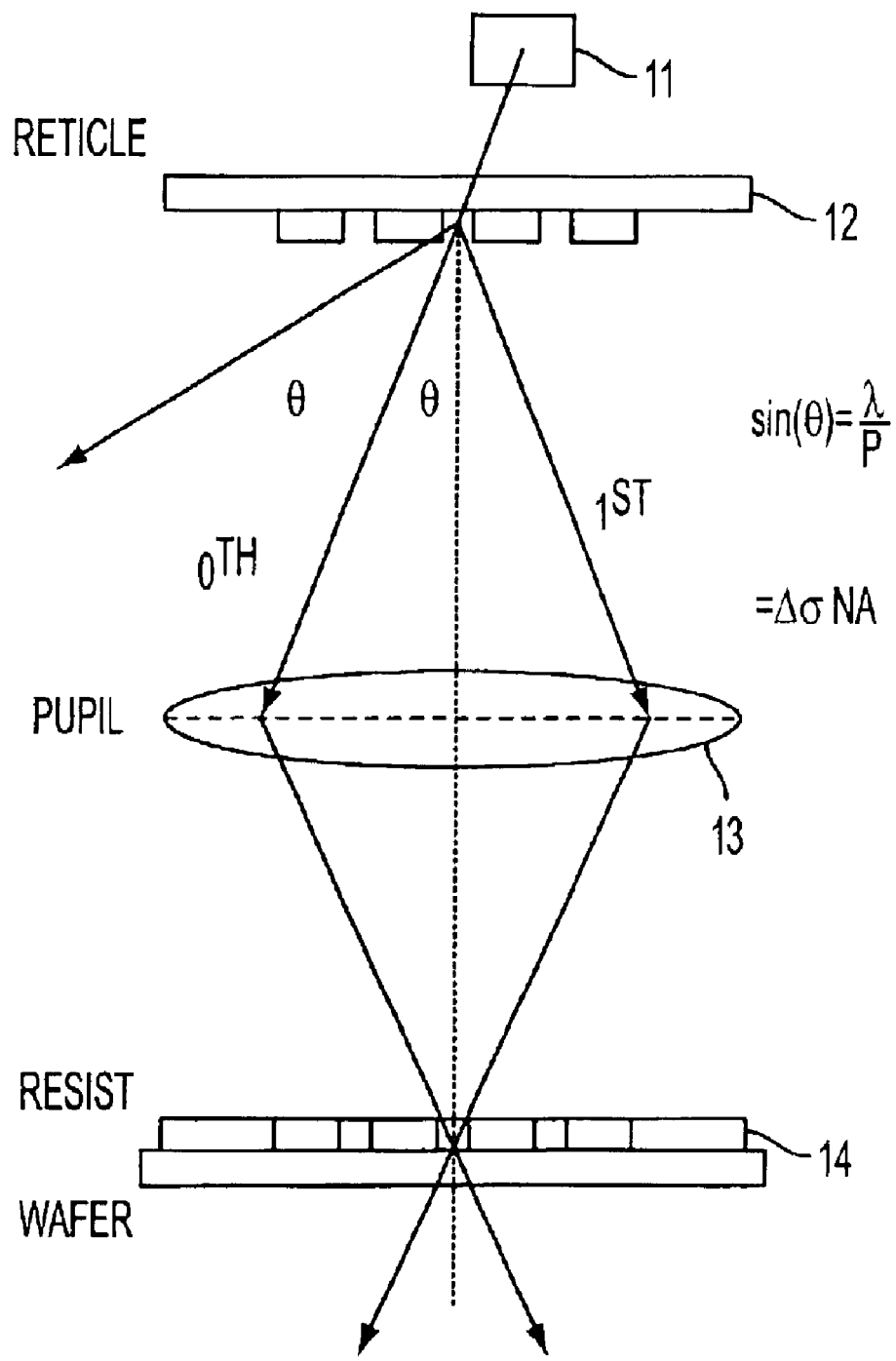
FIG. 1 illustrates the principles of off-axis illumination.

As explained in more detail below, the preferred embodiment of the present invention utilizes dipole illumination, which is an off-axis illumination (OAI) technique, in combination with a gate shrink technique in order to reduce the gate length of the transistors contained in the semiconductor device to be printed on a substrate. FIG. 1 illustrates the concept of off-axis illumination. As shown, increased focus latitude and image contrast are achieved by capturing at least one of the first orders of the pattern spatial frequencies. A typical off-axis illumination system includes in-part a light source 11, a mask 12, a lens 13 and the wafer 14 covered with photoresist.

Figure 2:
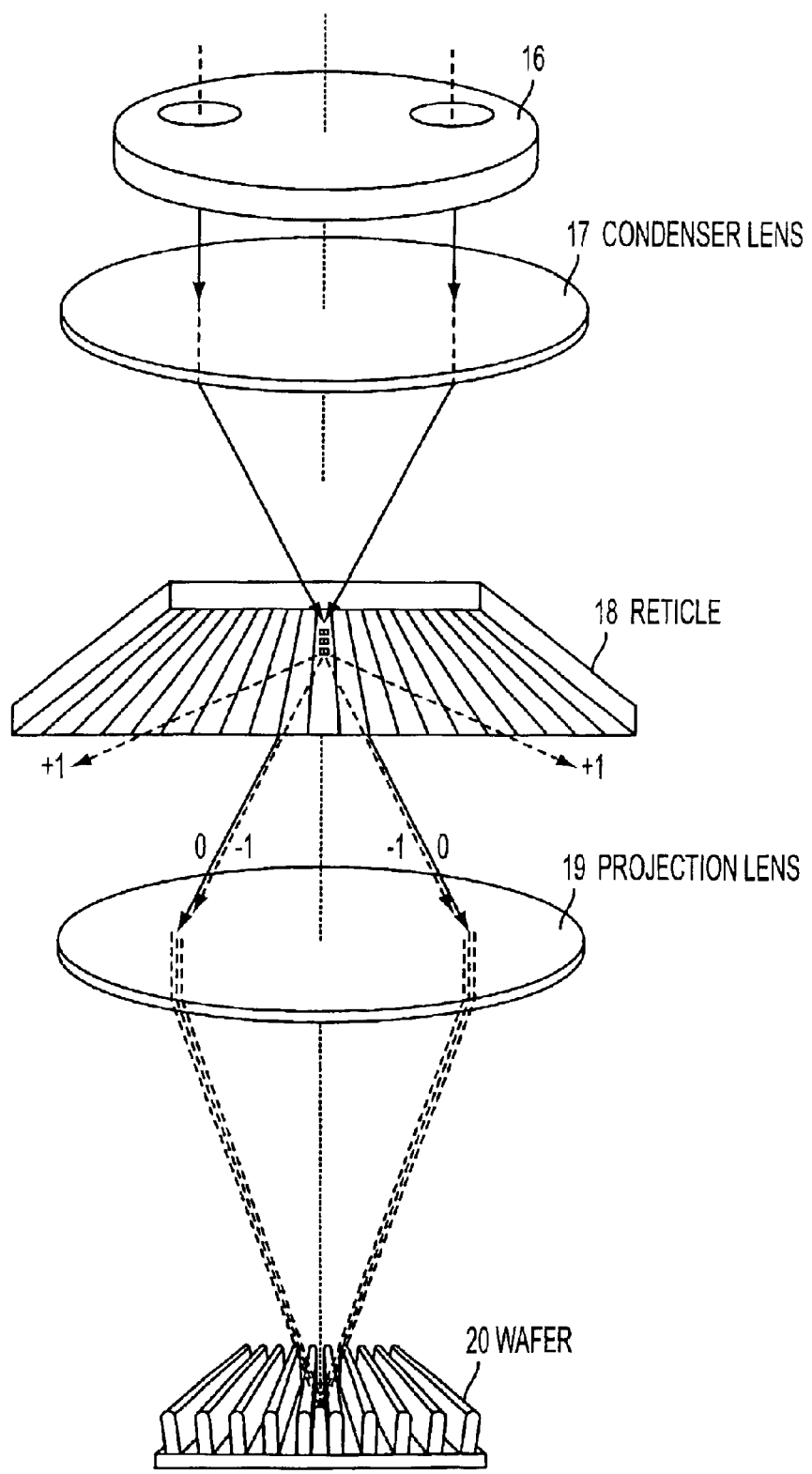
FIG. 2 illustrates the principles of dipole illumination.
Figure 3A:
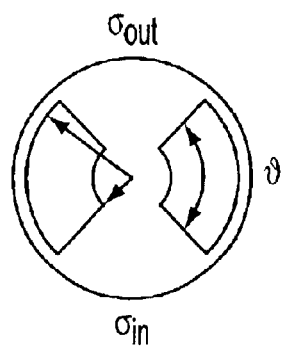
FIGS. 3($a$)–3($h$) illustrate exemplary shapes of dipole sources.
Figure 3E:
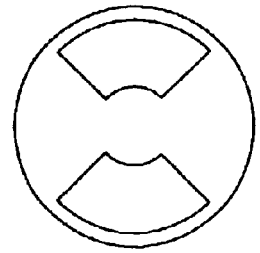
Figure 3B:
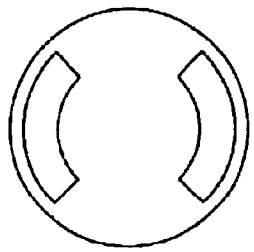
Figure 3F:
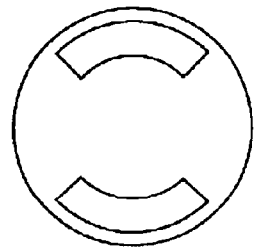
Figure 3C:
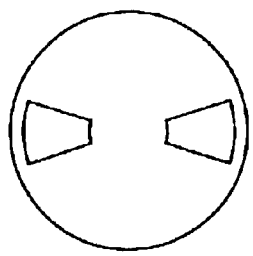
Figure 3G:
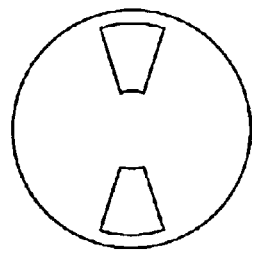
Figure 3D:
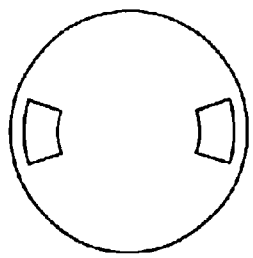
Figure 3H:
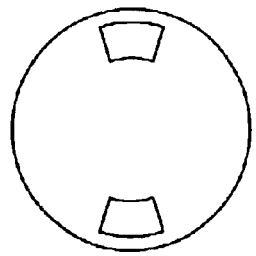

FIG. 2 illustrates the basic principles of dipole illumination. As is known, the light source is confined to two poles in order to create the conditions for two-beam imaging with theoretical infinite contrast. Referring to the example set forth in FIG. 2, the dipole illumination system includes in-part a dipole aperture 16 (or other dipole generating means, such as a suitable diffractive optical element), a condenser lens 17, a mask 18, a projection lens 19 and the wafer 20. The dipole apertures 16 can be of various shapes and orientations, e.g. horizontal, vertical or at any given angle. Exemplary dipole apertures 16 of various sizes and shapes are shown in FIGS. 3(a)–3(h). A detailed description of the concepts of dipole illumination is set forth in U.S. patent application Ser. No. 09/671,802, filed Sep. 28, 2000, which is hereby incorporated by reference.

Figure 4:
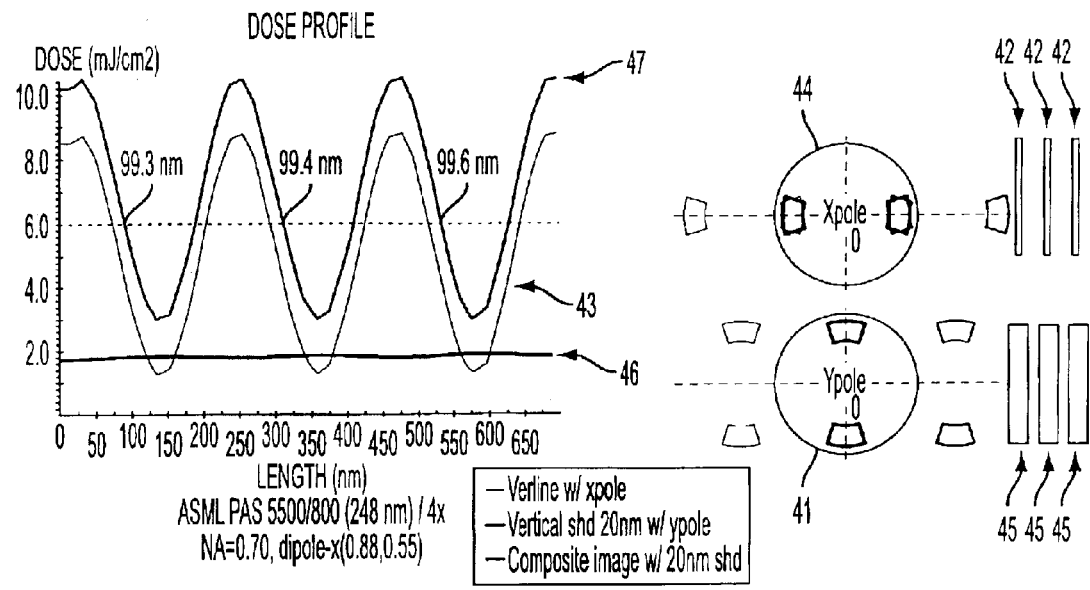
FIG. 4 illustrates the image intensity resulting from dipole illumination of 100 nm lines.

FIG. 4 illustrates dipole image formation, which is utilized in conjunction with the present invention. The example illustrated in FIG. 4 corresponds to the printing of 100 nm vertical lines 42. As is known, typically there are at least two exposures when utilizing dipole illumination. In the first exposure, the X dipole aperture 44 provides a maximum aerial image intensity (i.e., maximum modulation) for the vertical portion of the 100 nm lines 42. The resulting image profile is illustrated by line 43 in FIG. 4. In the second exposure, which utilizes the Y-dipole aperture 41, the maximum aerial image intensity is generated for the horizontal portion of the 100 nm lines 42. It is noted, however, that during the second exposure using the Y-dipole aperture, the vertical portions of the 100 nm lines need to be shielded so that the vertical features formed during the first exposure are not degraded during the second exposure. FIG. 4 illustrates shielding the 100 nm lines 42 with shields 45, each of which is 20 nm wide in the horizontal direction. As a result, when exposing the horizontal lines using the Y dipole aperture, there is substantially no imaging (i.e., modulation) of the vertical features 42. The aerial image is a DC modulation as shown by line 46 in FIG. 4, which corresponds to the 20 nm shielding. The final aerial image intensity, which is represented by line 47 in FIG. 4, corresponds to the sum of the first exposure using the X dipole aperture and the second exposure using the Y dipole aperture.

Figure 5:
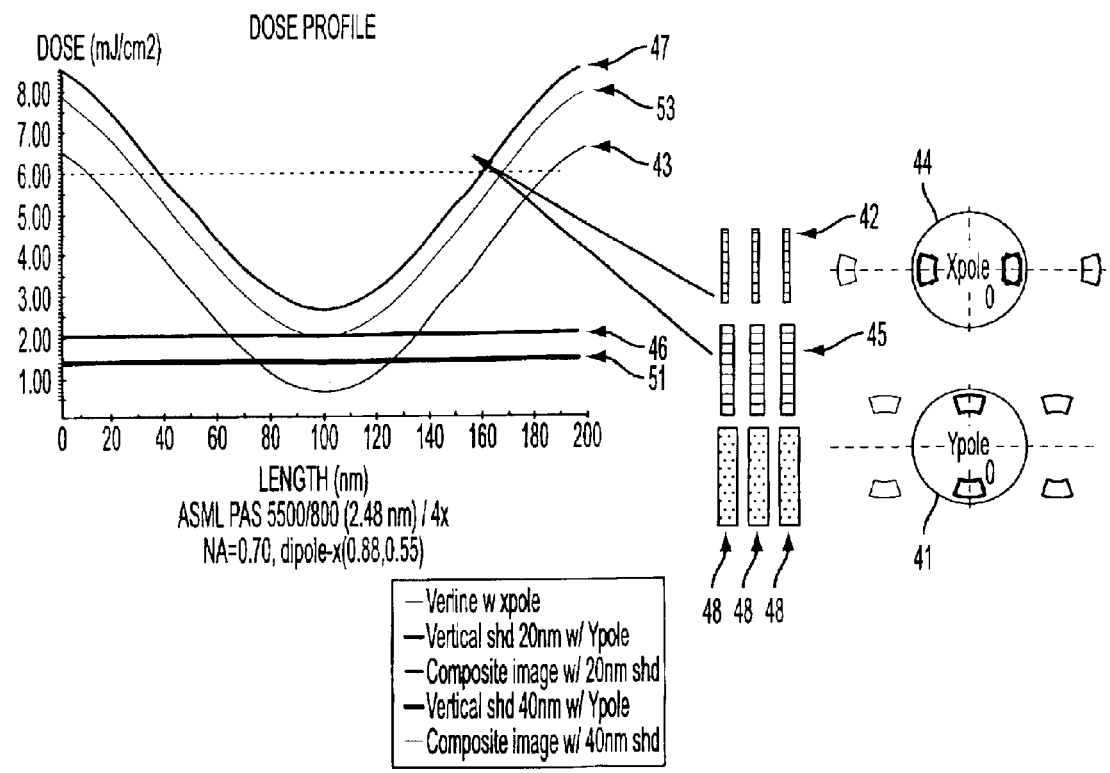
FIG. 5 illustrates the change in image intensity obtained by the illumination illustrated in FIG. 4 when the width of the shielding utilized in the second illumination is increased.

Referring to FIG. 5, it is noted that, assuming the exposure energy is constant, increasing the width of the shielding from a 20 nm shield 45 to a 40 nm shield 48 for the 100 nm vertical lines 42 causes the minimal intensity level of the resulting image to shift to a lower level. This is represented by line 51 in FIG. 5, which represents the aerial image associated with the vertical portions of the features. As shown, the aerial image 51 is just a DC modulation. However, it is lower than the DC modulation 46 associated with the 20 nm shield. As a result, the composite image 53 formed utilizing the 40 nm shielding provides better imaging results than the composite image 47 formed utilizing the 20 nm shielding.

It is noted that while either orientation may be illuminated first, typically the Y dipole aperture is illuminated first to print the horizontal features, followed by illumination of the X dipole aperture to print the vertical features. The Y dipole aperture and X dipole aperture are interchangeable only when the exposure energy is identical for both exposures.

As is clear from the foregoing, when utilizing dipole illumination techniques, the desired pattern to be imaged must be separated into independent horizontal and vertical geometries. However, in numerous semiconductor designs, such as static random access memory (SRAM), there are often 45 degree angles geometries (i.e., lines). Such 45 degree geometries that are considered short (e.g., the rectilinear distance measured from the short side of the polygon to the opposite short side of the polygon is less than five times of the critical dimension) can be deemed as either a vertical feature or a horizontal feature in the corresponding vertical or horizontal geometry. The 45 degree angled geometries that cannot be deemed short (i.e., those that exceed the foregoing definition of short) should be banned from the design, as such geometries cannot be readily reproduced on the wafer within acceptable limits.

Figure 6:
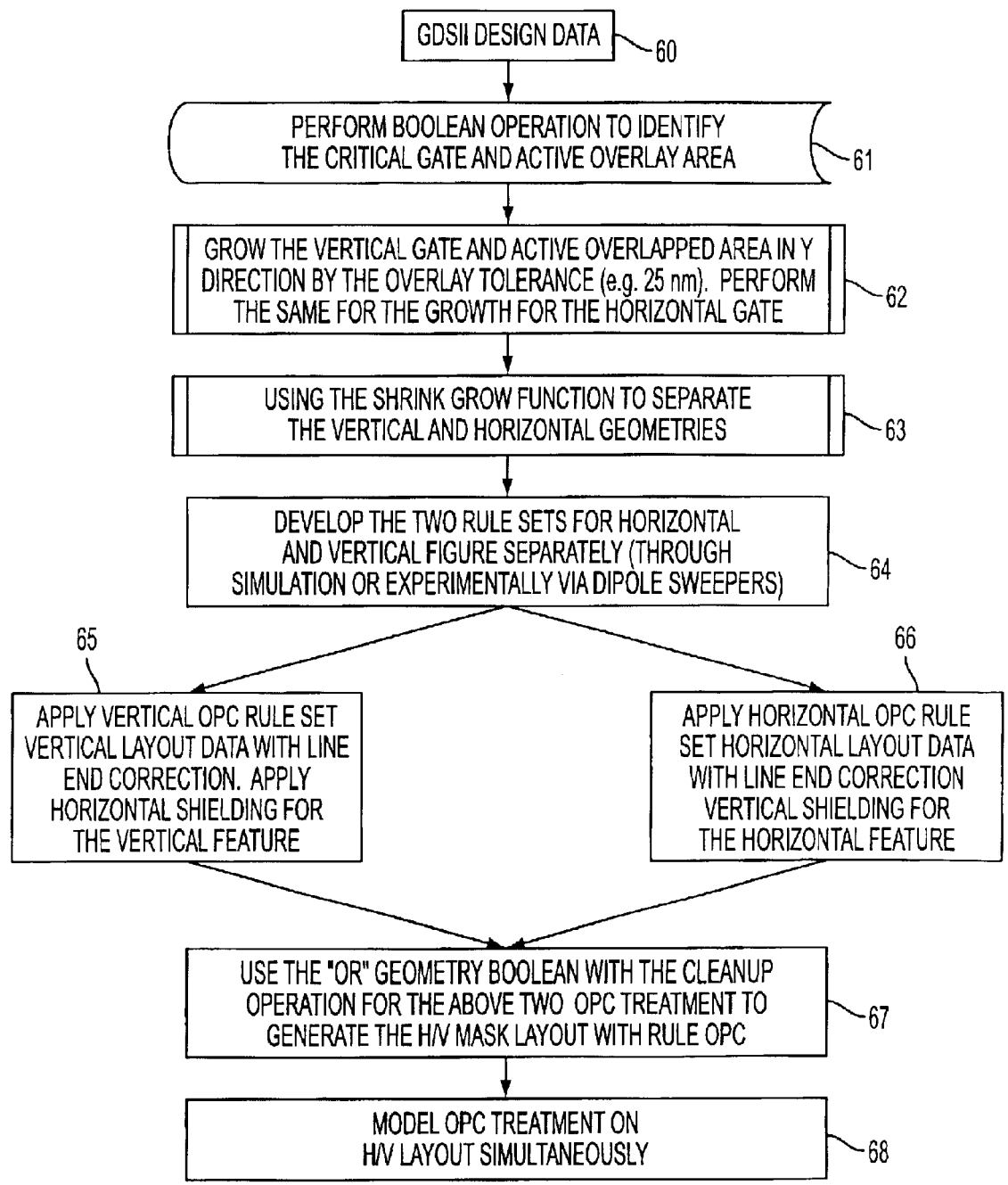
FIG. 6 is a flowchart representing an exemplary embodiment of the method of the present invention.
Figure 7:
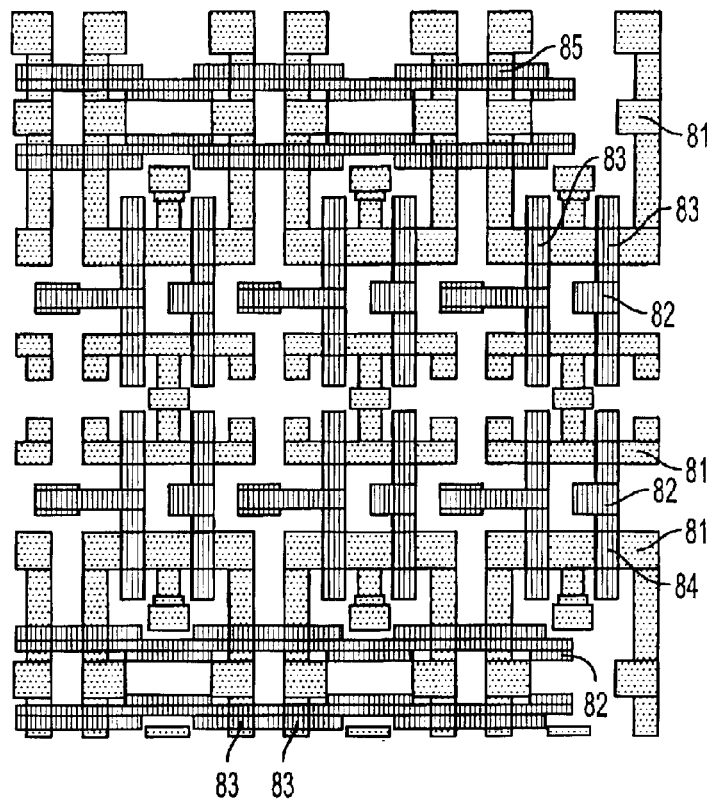
FIG. 7 illustrates an exemplary target design pattern, which is an SRAM design having 100 nm lines.

In accordance with the present invention, the foregoing decomposition of the pattern and subsequent dipole illumination is utilized in combination with the following gate shrink technique in order to achieve semiconductor designs having reduced gate lengths. FIG. 6 sets forth a flow chart illustrating an exemplary embodiment of the method of the present invention. Referring to FIG. 6, the first step 60 relates to obtaining the data associated with the desired pattern to be printed on the wafer or substrate. An exemplary pattern to be printed is illustrated in FIG. 7. As shown, the pattern contains active areas 81 and gate areas 82. The next step in the process, Step 61, entails identifying the portions of the gate areas 82 that overlap the active areas 81. Such areas are illustrated by reference numeral 83 in FIG. 7.

In the next step, Step 62, which is an optional step, the portions of the vertical gate areas 84 that overlay active areas 81 are extended in the vertical direction by an overlay tolerance (e.g., 25 nm) so as to provide correction against (or compensate for) misalignment tolerances. Similarly, the portions of the horizontal gate areas 85 that overlay active areas 81 are extended in the horizontal direction by the same overlay tolerance. While the amount of overlay varies in accordance the specifications of the apparatus utilized to image the substrate as well as the design rule requirements, typically, the overlay is in the range of 30% of the critical dimension.

Figure 8:
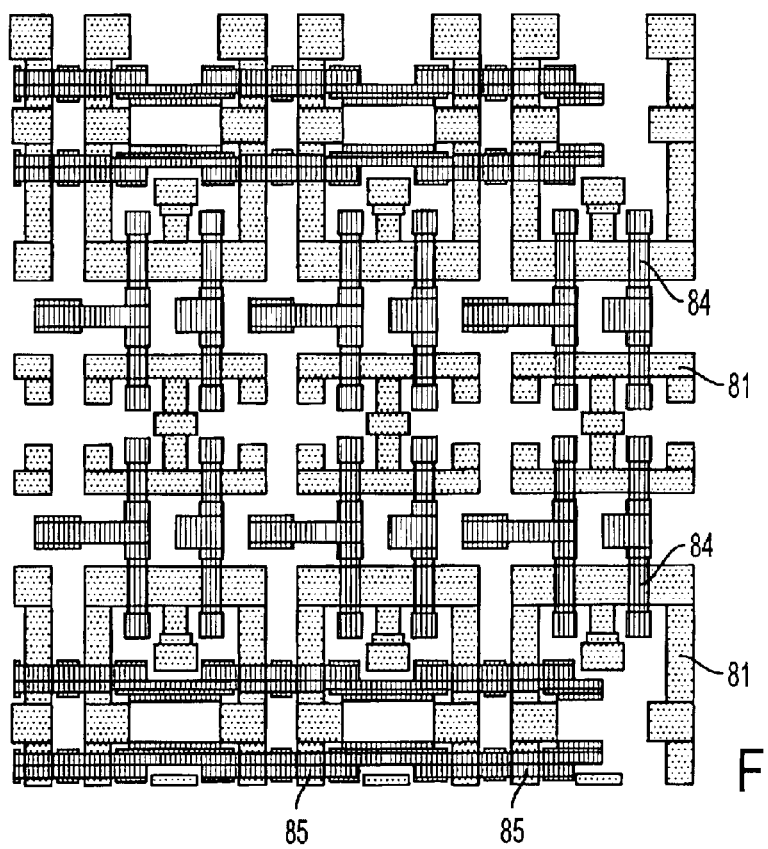
FIG. 8 illustrates the "gate shrink" step of the present invention in which the channel width of the gate portions which overlap with the active regions are reduced. In the given example, these overlapping portions of the gate pattern are reduced to 70 nm.
Figure 9:
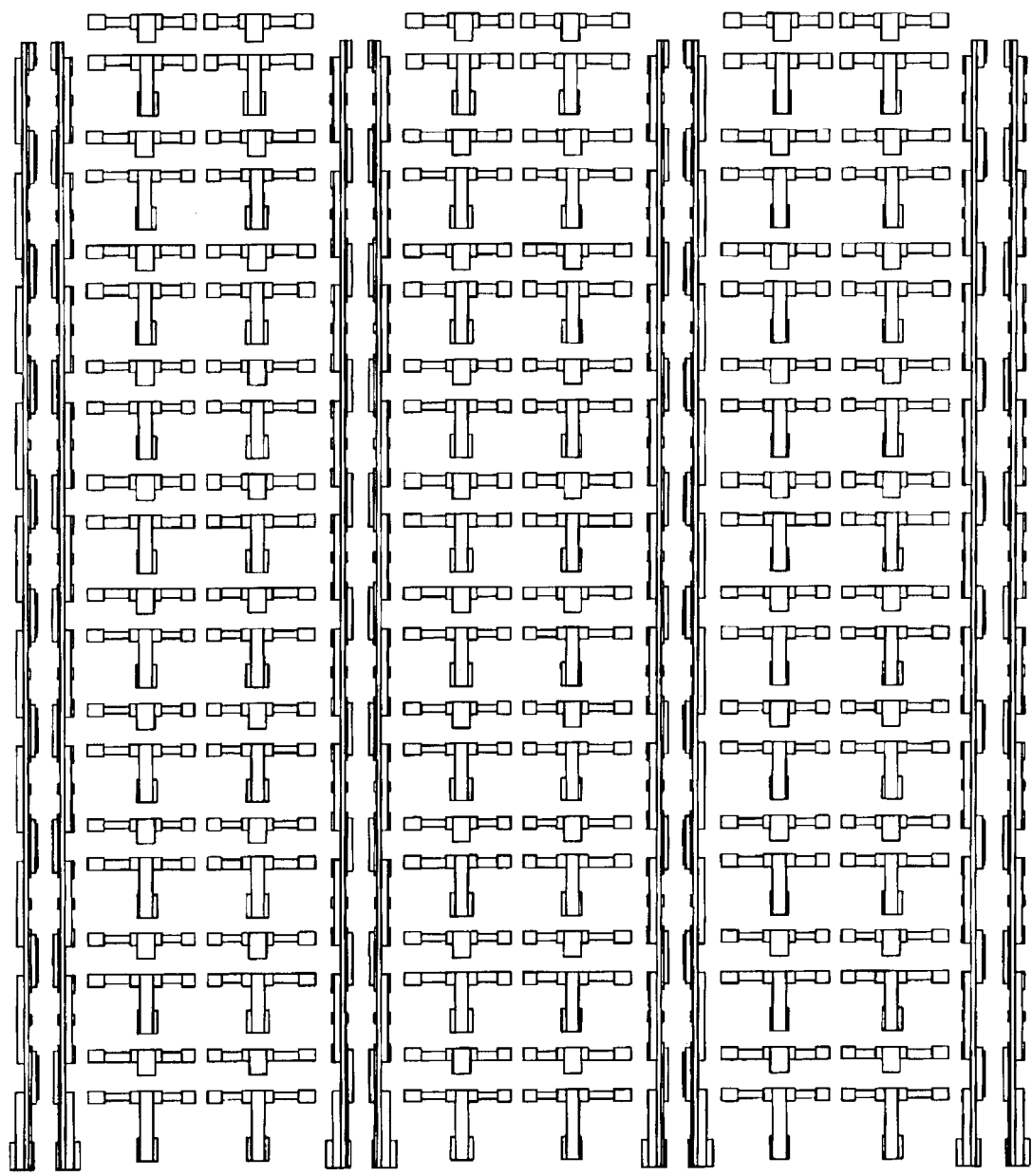
FIG. 9 illustrates the gate pattern of FIG. 8 extracted from the overall pattern illustrated in FIG. 8.
Figure 10:
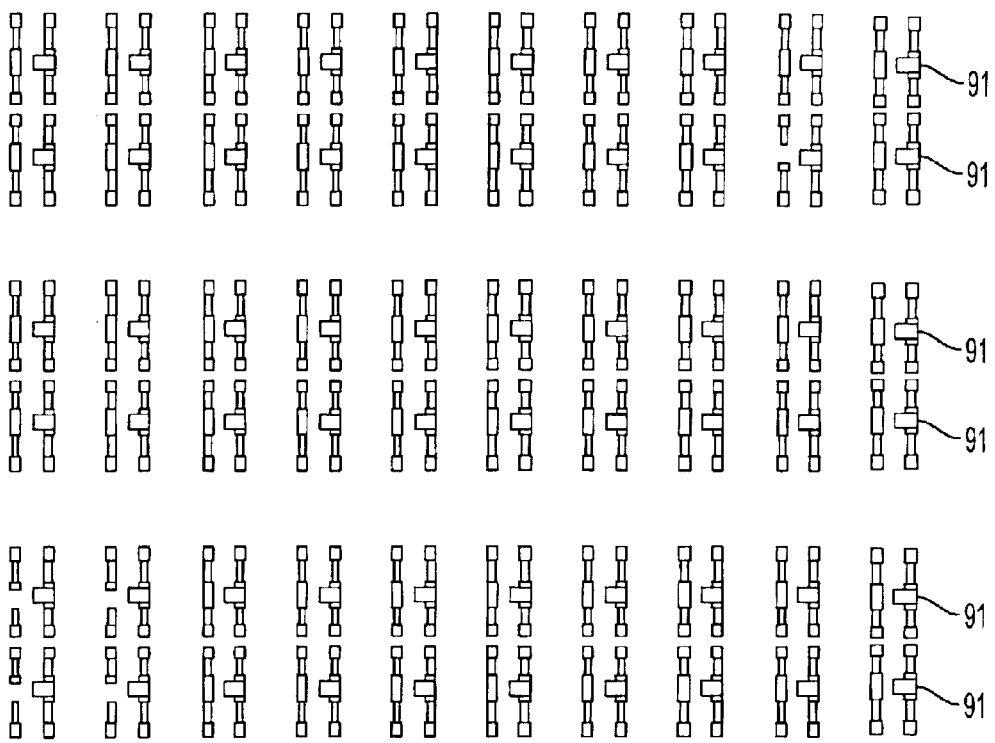
FIG. 10 illustrates the vertical component pattern extracted from the gate pattern of FIG. 9 utilizing the dipole decomposition method.
Figure 11:
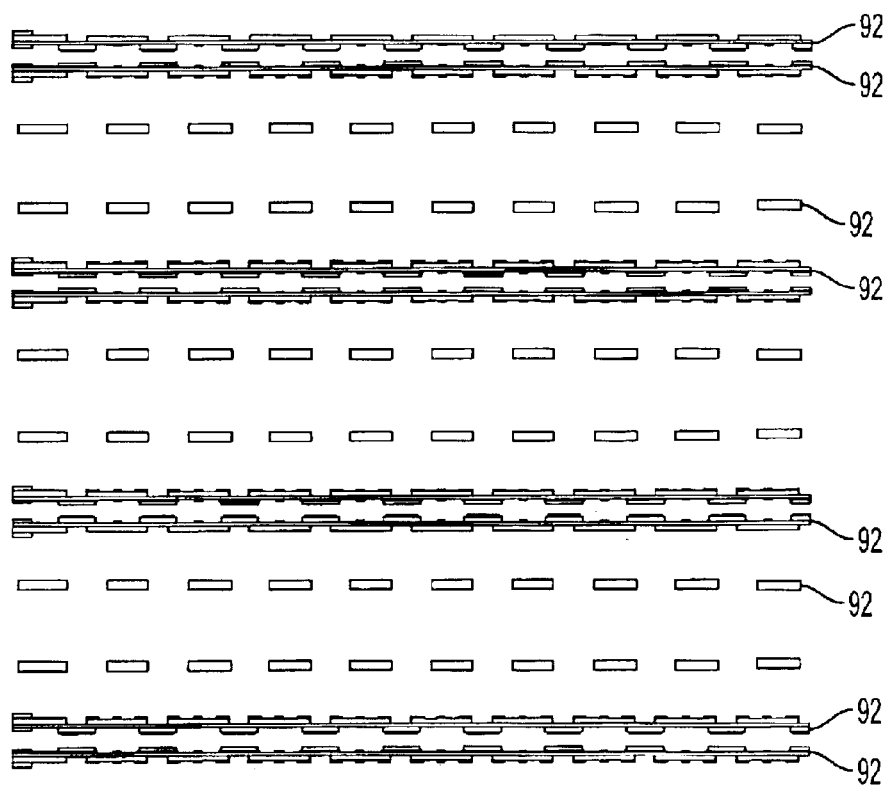
FIG. 11 illustrates the horizontal component pattern extracted from the gate pattern of FIG. 9 utilizing the dipole decomposition method.

Next, in Step 63, each of the vertical gate areas 84 that overlay active areas 81 and each of the horizontal gate areas 85 that overlay active areas 81 are reduced in size (i.e., shrunk), typically on the order of 10% or more, and the vertical and horizontal geometries of the gate pattern are separated from one another. The foregoing process is illustrated in FIGS. 8–11. First, FIG. 8 illustrates the gate shrink performed in conjunction with the present invention. As shown in FIG. 8, each of the vertical gate areas 84 are reduced in width (i.e., measured from edge to edge along the horizontal axis) by the foregoing amount, and each of the horizontal gate areas 85 are also reduced in width (i.e., measured from edge to edge along the vertical axis) by the same amount. In the current example, the original width of the gates areas 84 and 85 was 100 nm. These areas have been shrunk to a width of 70 nm. Next, as shown in FIG. 9, the "shrunk" gate pattern is extracted from the overall pattern (i.e., active areas). It is noted that both the vertical and horizontal geometries of the gate pattern are extracted. Thereafter, gate pattern is separated into vertical geometries 91 as shown in FIG. 10 and horizontal geometries 92 as shown in FIG. 11 in the same manner as discussed above with regard to dipole illumination.

Next, in Step 64, two test patterns, one for horizontal features and one for vertical features, are generated and thereafter utilized to determine the performance of the particular imaging system for various pitches and line:space ratios. These test patterns are then tested, either via simulation or experimentally, to determine the resulting performance for the various pitch conditions set forth in the test patterns. The performance results are then utilized to determine whether optical proximity correction features are necessary to improve imaging performance. It is noted that Step 64 is an optional step in the process.

Figure 12:
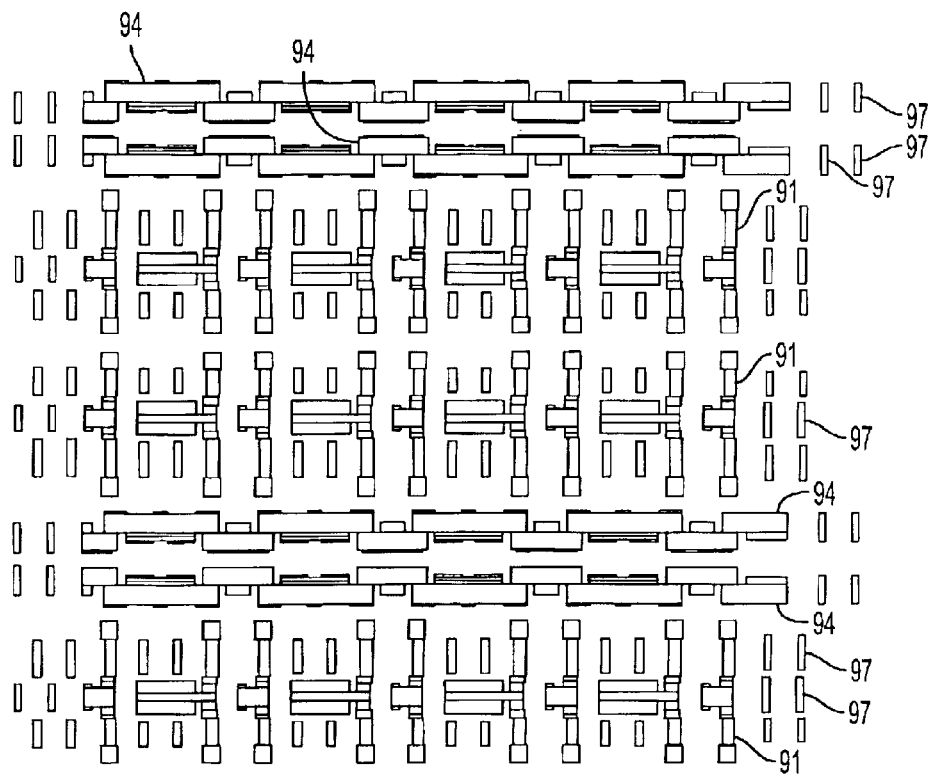
FIG. 12 illustrates the vertical component mask after application of shielding and optical proximity correction techniques.
Figure 13:
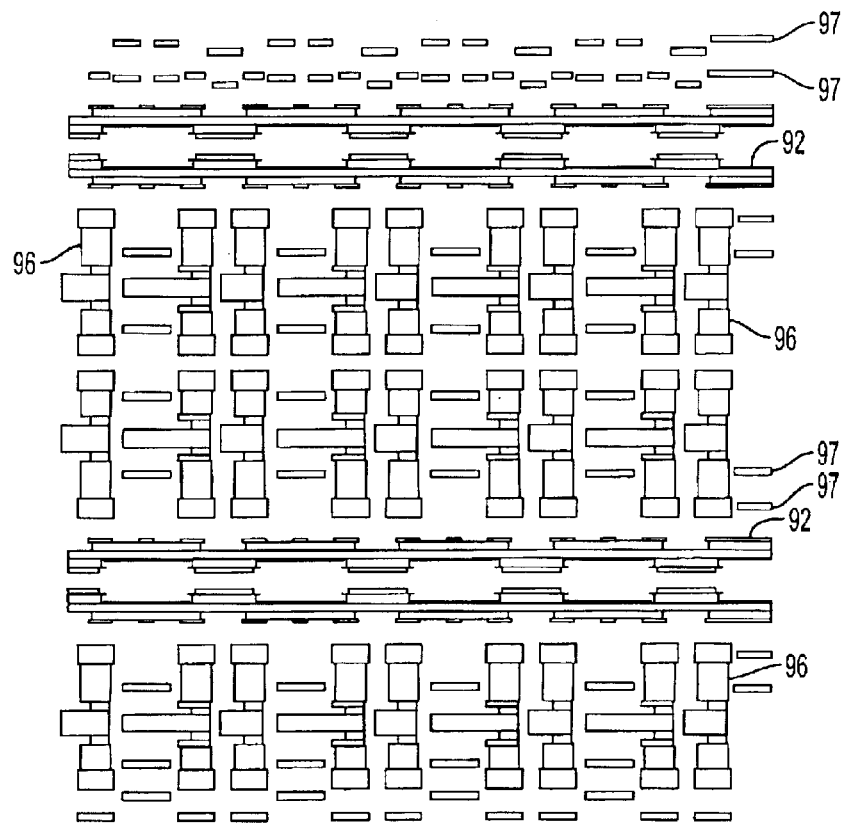
FIG. 13 illustrates the horizontal component mask after application of shielding and optical proximity correction techniques.

Referring to FIGS. 12 and 13, the next steps in the process, Steps 65 and 66, require shielding to be applied to the vertical features 91 and horizontal features 92. More specifically, FIG. 12 illustrates the mask (i.e., vertical mask) for printing the vertical gate areas 91 contained in the desired gate pattern. As shown in FIG. 12, shielding 94 is added to the horizontal features 92 contained in the vertical mask so as to prevent the horizontal features from being exposed. It is noted that typically, the dimensions (i.e., width) of the shield is as large as that the mask pattern allows for (e.g., such that the shield does not interfere with adjacent features. Similarly, FIG. 13 illustrates the mask (i.e., horizontal mask) for printing the horizontal gate areas 92 contained in the pattern. As shown in FIG. 13, shielding 96 is added to the vertical features 91 contained in the horizontal mask so as to prevent the vertical features from being exposed. The shielding is applied in the same manner as discussed above with regard to dipole illumination. It is further noted that both the vertical mask illustrated in FIG. 12 and the horizontal mask illustrated in FIG. 13 included optical proximity features 97, such as line end correction and scatter bars. Such OPC techniques are optional, but often utilized.

Once the shielding (and optionally OPC) has been applied to both the vertical mask and the horizontal mask, in Step 67, both the vertical mask and the horizontal mask are subjected to a cleanup operation utilizing a Boolean "OR" operation to remove extraneous images not corresponding to a desired feature or OPC feature.

The final step in the flowchart of FIG. 6 is Step 68, and as with Step 64, this step is also an optional step. In accordance with Step 68, when performing optical proximity correction techniques to improve the overall imaging performance, it is necessary to consider the OPC techniques being applied in conjunction with both the vertical mask and horizontal mask. This is due to the fact that the method of the present invention is a two illumination process. In other words, the OPC techniques must be considered in conjunction with the composite resist pattern resulting from illumination by both the vertical and horizontal mask.

Upon completion of the foregoing process, the vertical mask and the horizontal mask for printing the "shrunk" gate features utilizing dipole illumination are complete, and can be utilized to print the "shrunk" gate pattern on the wafer. As noted above, the vertical and horizontal masks are utilized in two separate illuminations.

Figure 14:
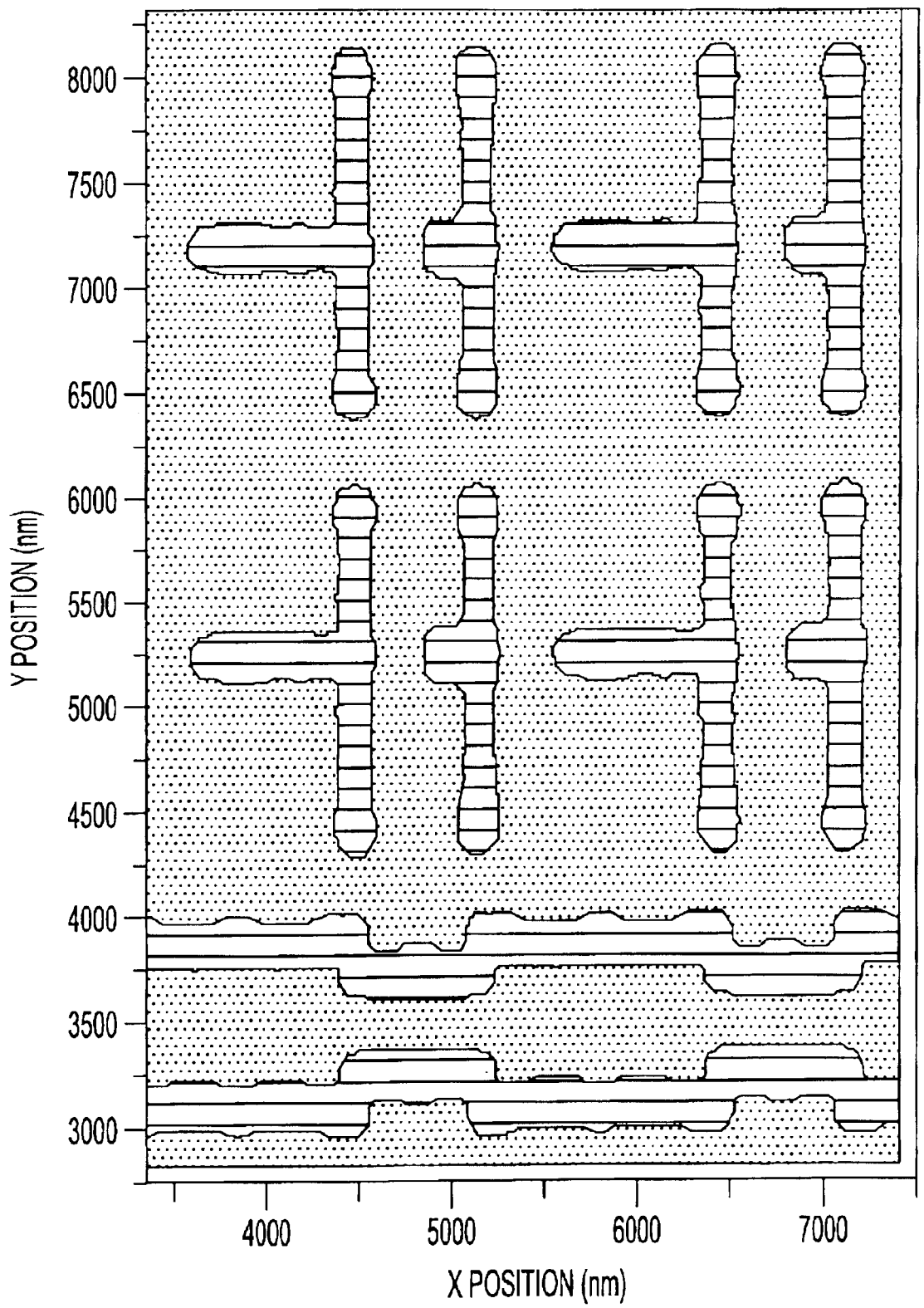
FIG. 14 illustrates the simulation result obtained by illuminating the substrate utilizing the masks illustrated in FIGS. 12 and 13.
Figure 15:
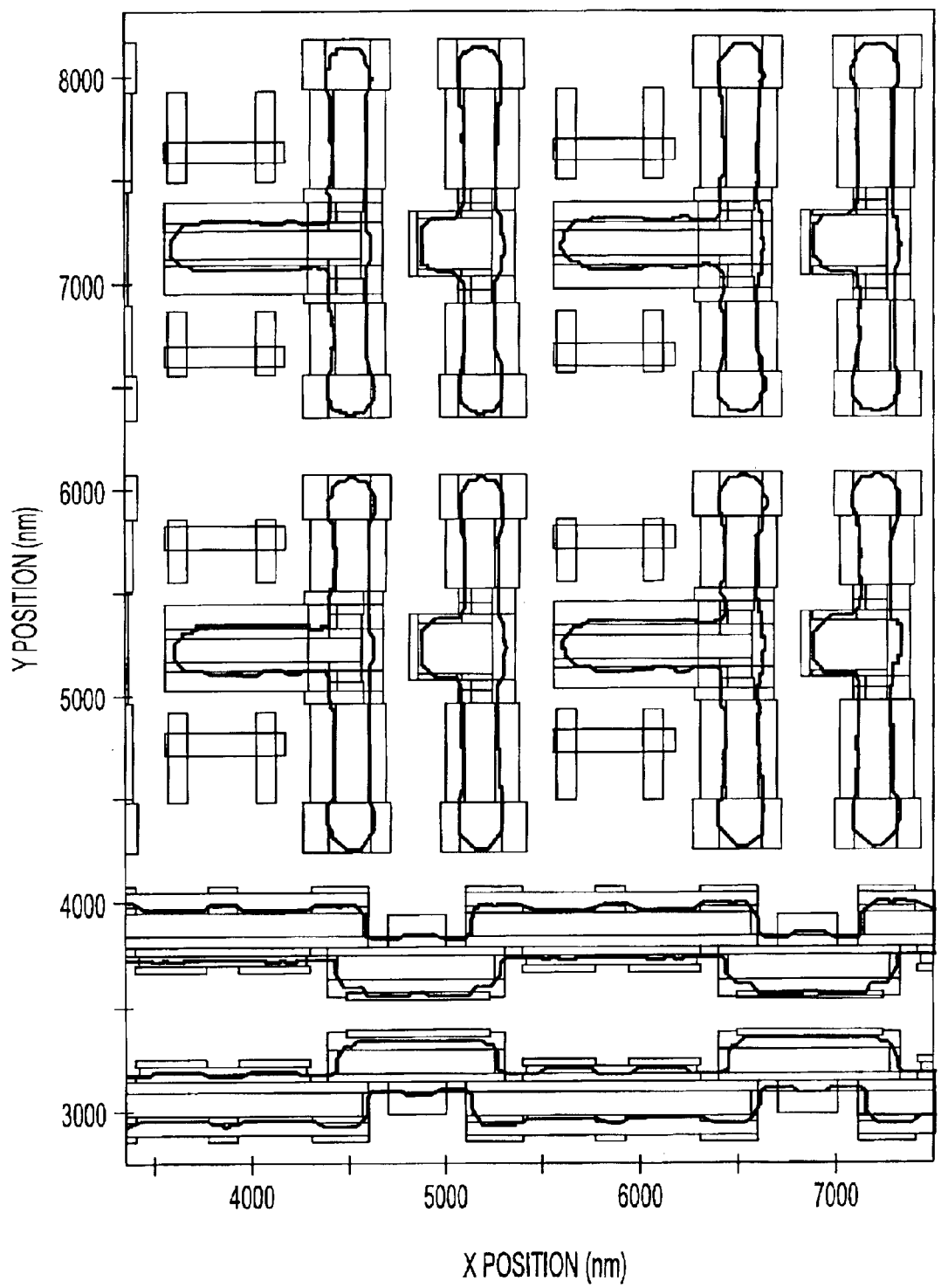
FIG. 15 illustrates the simulation results of FIG. 14 superimposed on the vertical mask and horizontal mask illustrated in FIGS. 12 and 13. As shown, the simulation result accurately corresponds to the desired pattern.
Figure 16:
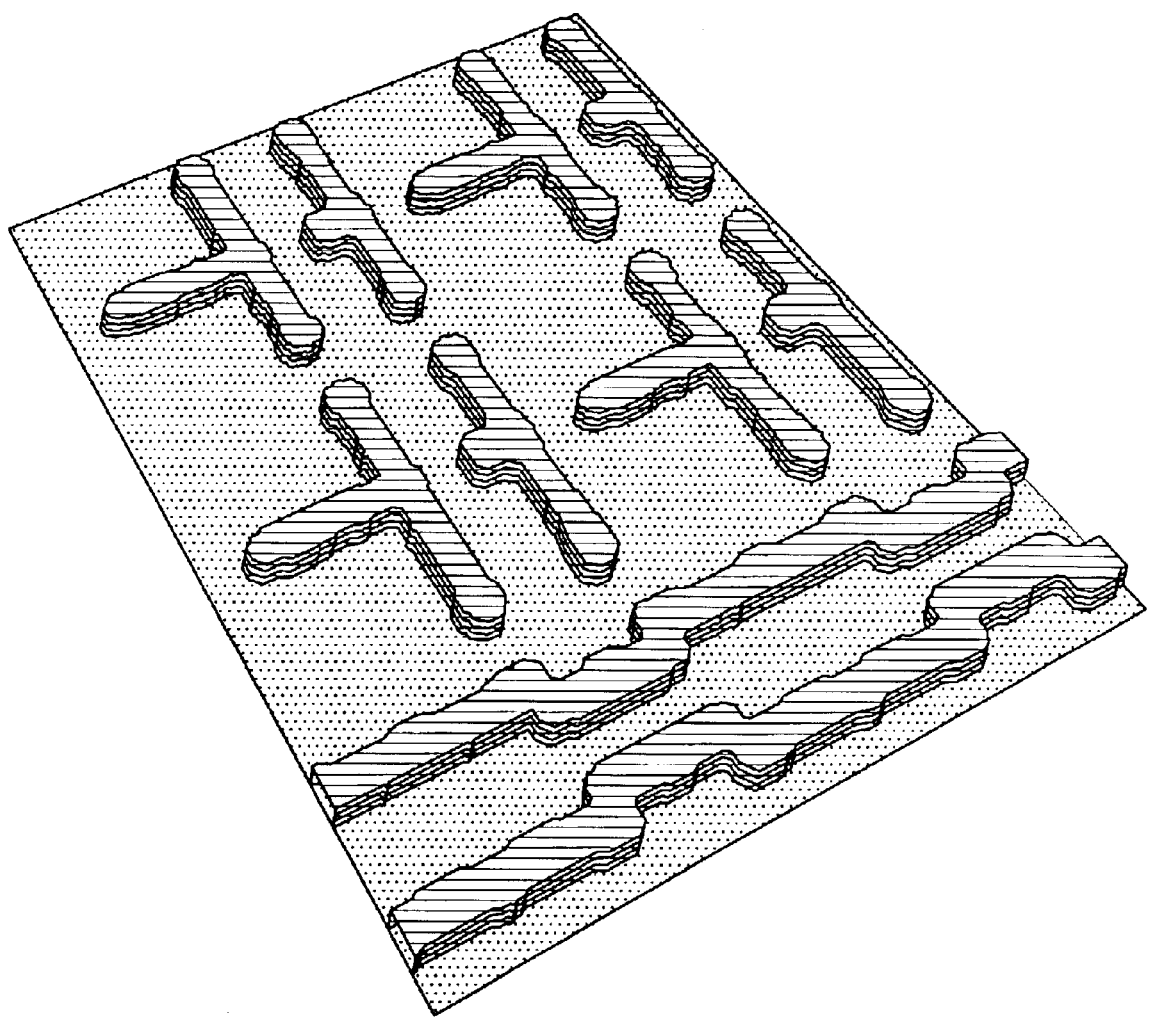
FIG. 16 illustrates the 3-dimensional resist profile of the gate pattern of the foregoing example obtained utilizing the method of the present invention.

FIG. 14 illustrates a simulation result obtained utilizing the forgoing process in a full resist simulation. More specifically, FIG. 14 illustrates the result of a top down resist image of the pattern illustrated in FIG. 5 (i.e., a 100 nm SRAM with gate shrunk to 70 nm) utilizing the process of the present invention. As shown in FIG. 14, by utilizing proper vertical and horizontal pole illumination settings, which are determined in-part based on the process equipment being utilized, the gate region is transferred to the resist with clear pattern definition. It is further noted that the line-end shortening error is also fully corrected. FIG. 15 illustrates the simulation results of FIG. 14 superimposed on the vertical mask and horizontal mask illustrated in FIGS. 12 and 13. As shown, the simulation result accurately corresponds to the desired pattern. FIG. 16 illustrates the 3-dimensional resist profile of the gate pattern of the foregoing example obtained utilizing the method of the present invention.

It is noted that while the method of the present invention has been applied to the design of an SRAM device in the foregoing example, it is not so limited. The foregoing design method can be utilized in the formation of other logic designs or IC designs.

Furthermore, while the method described above performs the process of shrinking the gate prior to the decomposition of the vertical and horizontal gate features, it is also possible to perform the decomposition of the vertical and horizontal gate features prior to performing the gate shrink step. Thus, the gate shrink step can be performed before or after the vertical and horizontal component decomposition.

Figure 17:
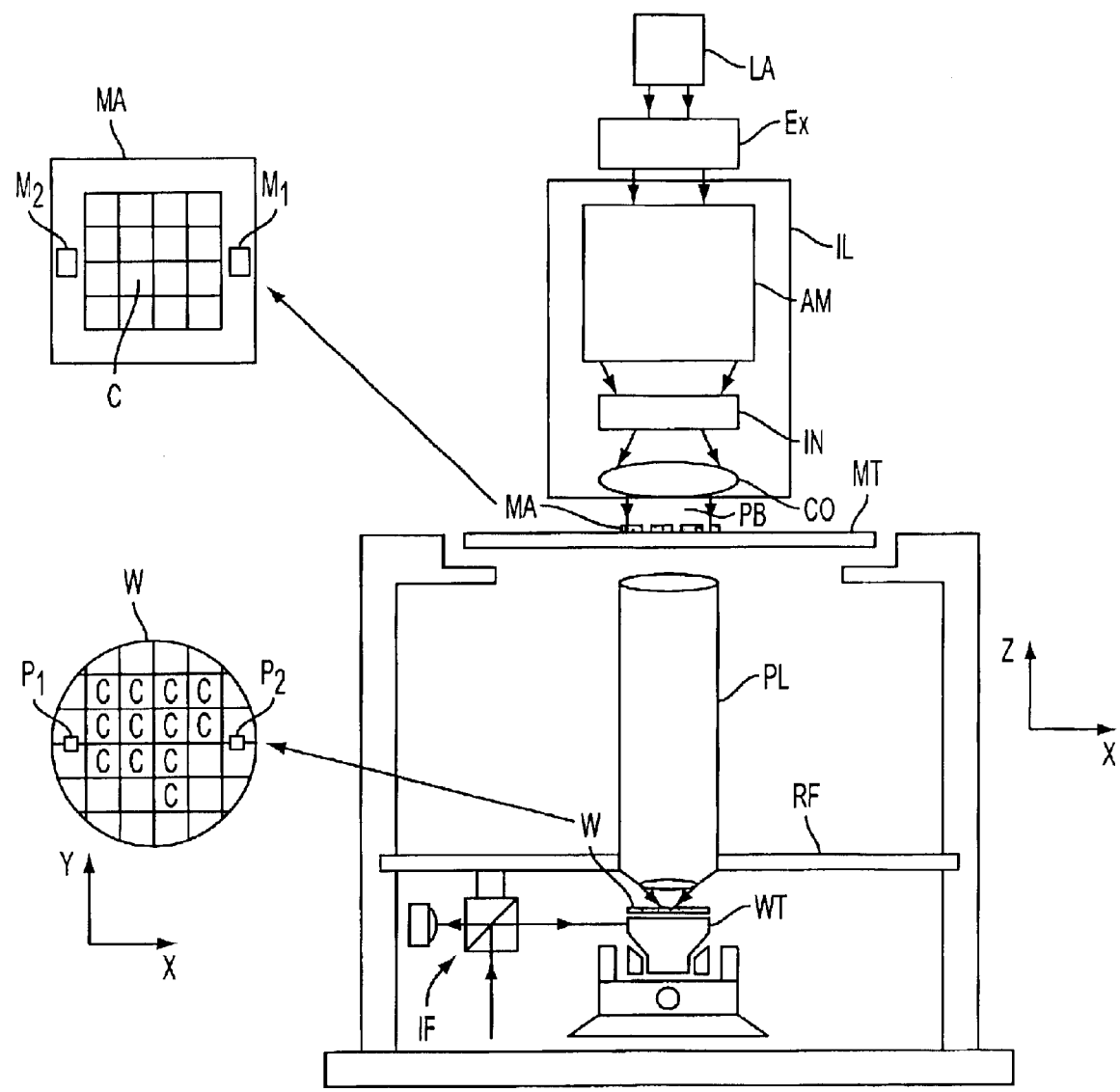
FIG. 17 schematically depicts a lithographic projection apparatus suitable for use with the masks designed with the aid of the current invention.

FIG. 17 schematically depicts a lithographic projection apparatus suitable for use with the masks designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 17 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 17. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

As described above, the method of the present invention provides important advantages over the prior art. For example, the present invention provides a simple method for reducing the gate length of the transistor utilizing currently available photolithography technologies. As noted above, a reduced gate length advantageously results in an increase in transistor operating speed, a reduction in transistor power requirements, and a reduction in leakage current. Importantly, the technique of the present invention allows for the reduction in the transistor gate length without a complete resealing of the semiconductor design.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method of printing a pattern on a substrate, which includes both gate features and active regions, said method comprising the steps of:

identifying at least one area in said pattern in which one of said gate features overlays one of said active regions;

reducing a width dimension of said one of said gate features at the location which said one of said gate features overlays said one of said active regions;

extracting said gates features from said pattern;

decomposing said gate features into a vertical component mask and a horizontal component mask; and illuminating said vertical component mask and said horizontal component mask utilizing dipole illumination.

2. The method of claim 1, wherein each of said gate features having a portion which overlays an active region is reduced in the width dimension at the location that the gate feature overlays the active region.

3. The method of claim 1, further comprising the step of adding shielding components to said vertical component mask, said shielding components preventing illumination of horizontal components contained in said gate features when said vertical component mask is illuminated.

4. The method of claim 1, further comprising the step of adding shielding components to said horizontal component mask, said shielding components preventing illumination of vertical components contained in said gate features when said horizontal component mask is illuminated.

5. The method of claim 1, further comprising the step of adding optical proximity correction features to said vertical component mask and to said horizontal component mask.

6. The method of claim 1, wherein said vertical component mask comprises vertical gate components to be printed on said substrate, and said horizontal component mask comprises horizontal gate components to be printed on said wafer.

7. The method of claim 6, wherein for each vertical gate component overlaying an active region, adjusting said vertical component mask so as to increase the amount of the overlay of the vertical gate component in the vertical direction, and for each horizontal gate component overlaying an active region, adjusting said horizontal component mask so as to increase the amount of the overlay of the horizontal gate component in the horizontal direction.

8. A method of generating complementary masks for use in a multiple-exposure lithographic imaging process, said method comprising the steps of:

defining a pattern to be printed on a substrate, said pattern including both gate features and active regions;

identifying at least one area in said pattern in which one of said gate features overlays one of said active regions;

reducing a width dimension of said one of said gate features at the location which said one of said gate features overlays said one of said active regions;

extracting said gates features from said pattern; and decomposing said gate features into a vertical component mask and a horizontal component mask.

9. The method of claim 8, wherein each of said gate features having a portion which overlays an active region is reduced in the width dimension at the location that the gate feature overlays the active region.

10. The method of claim 8, further comprising the step of adding a first set of shielding components to said vertical component mask, said first set of shielding components preventing illumination of horizontal components contained in said gate features when said vertical component mask is illuminated, and the step of adding a second set of shielding components to said horizontal component mask, said second set of shielding components preventing illumination of vertical components contained in said gate features when said horizontal component mask is illuminated.

11. The method of claim 8, further comprising the step of adding optical proximity correction features to said vertical component mask and to said horizontal component mask.

12. An apparatus for generating complementary mask patterns for use in a multiple-exposure lithographic imaging process, said apparatus comprising:

means for defining a pattern to be printed on a substrate, said pattern including both gate features and active regions;

means for identifying at least one area in said pattern in which one of said gate features overlays one of said active regions;

means for reducing a width dimension of said one of said gate features at the location which said one of said gate features overlays said one of said active regions;

means for extracting said gates features from said pattern; and means for decomposing said gate features into a vertical component mask and a horizontal component mask.

13. The apparatus of claim 12, wherein each of said gate features having a portion which overlays an active region is reduced in the width dimension at the location that the gate feature overlays the active region.

14. The apparatus of claim 12, further comprising means for adding a first set of shielding components to said vertical component mask, said first set of shielding components preventing illumination of horizontal components contained in said gate features when said vertical component mask is illuminated, and the step of adding a second set of shielding components to said horizontal component mask, said second set of shielding components preventing illumination of vertical components contained in said gate features when said horizontal component mask is illuminated.

15. The apparatus of claim 12, further comprising the step of adding optical proximity correction features to said vertical component mask and to said horizontal component mask.

16. A computer program product for controlling a computer comprising a recording medium readable by the computer, means recorded on the recording medium for directing the computer to generate files corresponding to complementary masks for use in a multiple-exposure lithographic imaging process, said generation of said files comprising the steps of:

defining a pattern to be printed on a substrate, said pattern including both gate features and active regions;

identifying at least one area in said pattern in which one of said gate features overlays one of said active regions;

reducing a width dimension of said one of said gate features at the location which said one of said gate features overlays said one of said active regions;

extracting said gates features from said pattern; and decomposing said gate features into a vertical component mask and a horizontal component mask.

17. The computer program product of claim 16, wherein each of said gate features having a portion which overlays an active region is reduced in the width dimension at the location that the gate feature overlays the active region.

18. The computer program product of claim 16, wherein the generation of said files further comprising the step of adding a shielding components to said vertical component mask, said shielding components preventing illumination of horizontal components contained in said gate features when said vertical component mask is illuminated.

19. The computer program product of claim 16, wherein the generation of said files further comprising the step of adding a shielding components to said horizontal component mask, said shielding components preventing illumination of vertical components contained in said gate features when said horizontal component mask is illuminated.

20. The computer program product of claim 16, wherein the generation of said files further comprising the step of adding optical proximity correction features to said vertical component mask and to said horizontal component mask.

21. The computer program product of claim 16, wherein said vertical component mask comprises vertical gate components to be printed on said substrate, and said horizontal component mask comprises horizontal gate components to be printed on said wafer.

22. The computer program product of claim 21, wherein for each vertical gate component overlaying an active region, adjusting said vertical component mask so as to increase the amount of the overlay of the vertical gate component in the vertical direction, and for each horizontal gate component overlaying an active region, adjusting said horizontal component mask so as to increase the amount of the overlay of the horizontal gate component in the horizontal direction.

23. A device manufacturing method comprising the steps of:

(a) providing a substrate that is at least partially covered by a layer of radiation-sensitive material;

(b) providing a projection beam of radiation using a radiation system;

(c) using patterning means to endow the projection beam with a pattern in its cross-section;

(d) projecting the patterned beam of radiation onto a target portion of the layer of radiation-sensitive material, wherein steps (c) and (d) are performed a first time with a first pattern and then a second time with a second pattern, said first and second patterns being generated using a method according to claim 8.

* * * * *